United States Patent [19]

Higaki et al.

[11] Patent Number: 5,496,797
[45] Date of Patent: Mar. 5, 1996

[54] SUPERCONDUCTING MICROWAVE PARTS HAVING A PACKAGE, TWO SUBSTRATES, AND LINE AND GROUNDING CONDUCTORS

[75] Inventors: Kenjiro Higaki; Hideo Itozaki, both of Itami, Japan

[73] Assignee: Sumitomo Electric Industries, Ltd., Osaka, Japan

[21] Appl. No.: 353,344

[22] Filed: Dec. 5, 1994

Related U.S. Application Data

[63] Continuation of Ser. No. 141,588, Oct. 27, 1993, abandoned, which is a continuation of Ser. No. 781,352, Oct. 25, 1991, abandoned.

[30]     Foreign Application Priority Data

Oct. 29, 1990  [JP]  Japan ................................ 2-291195

[51] Int. Cl.⁶ .............................. H01P 3/08; H01B 12/06
[52] U.S. Cl. .................... 505/210; 505/700; 505/701; 505/866; 333/99 S; 333/246
[58] Field of Search ................. 333/99 S, 238, 333/246, 219; 505/1, 700, 701, 866, 210; 174/52.1; 361/752

[56]          References Cited

FOREIGN PATENT DOCUMENTS 435765   7/1991   European Pat. Off. .

OTHER PUBLICATIONS

Talisa, et al, "Microwave Superconducting Filters", *IEEE Transactions on Magnetics*, vol. 27, No. 2, New York, U.S., pp. 2544–2547 (Mar. 1991).

Martens, et al "A Film Transmission Line Resonator to Measure the Microwave Surface Resistance of $YBa_2Cu_3O_{7-x}$", *IEEE Transactions on Magnetics*, vol. 25, No. 2, New York, U.S. pp. 984–986 (Mar. 1989).

Withers et al, "Hight–$T_c$ Superconducting Thin Films For Microwave Applications", *Solid State Technology*, vol. 33, No. 8, Tulsa, U.S., pp. 83–87 (Aug. 1990).

*Primary Examiner*—Benny T. Lee
*Attorney, Agent, or Firm*—Beveridge, DeGrandi, Weilacher & Young

[57]          ABSTRACT

There is disclosed a superconducting microwave component including a first substrate having a conductor line formed of an oxide superconductor on the surface thereof, a second substrate having a grounding conductor formed of an oxide superconductor on the surface thereof, and a package of a conducting material housing the first and the second substrates so that they are substantially parallel with each other. At least one portion of the grounding conductor is in contact with the inside of the package, through surface contact.

38 Claims, 6 Drawing Sheets

SUPERCONDUCTING MICROWAVE PARTS HAVING A PACKAGE, TWO SUBSTRATES, AND LINE AND GROUNDING CONDUCTORS

This application is a continuation of application Ser. No. 08/141,588, filed Oct. 27, 1993, hereby abandoned, which application was a continuation of application Ser. No. 07/781,352, filed on Oct. 25, 1991, now abandoned, which applications are entirely incorporated herein by reference.

BACKGROUND OF THE INVENTION

1. Field of the Invention

This invention relates to superconducting microwave components. More specifically, this invention relates to high frequency parts for treating electromagnetic waves having short wavelengths, such as microwaves, millimeter waves or others, and especially to constitutions of novel microwave components having conductor lines formed of oxide superconducting materials.

2. Related Background Art

Although the electromagnetic waves having wavelengths from tens of centimeters to some millimeters are called microwaves, millimeter waves or others are theoretically only a part of the electromagnetic wave spectrum, these electromagnetic waves are, in many cases, specially studied independently in the engineering field because special means and parts have been developed for treating these electromagnetic waves. The microwave line for guiding the electromagnetic waves in this band comprises a pair of conductor lines arranged through a dielectric and having one of the conductor lines grounded.

On the other hand, in 1988 $(La,Ba)_2CuO_2$ which exhibits superconductivity at 30K was discovered by Bednorz, Mueller, et al. In the next year 1987 $YBa_2Cu_3O_y$ having a critical superconducting temperature in the order of 90K was discovered by Chu, et al. In 1988 Maeda, et al. discovered the so-called Bi-based composite oxide superconducting material which exhibits a critical superconducting temperature exceeding 100K. Since these composite oxide superconductors can realize superconductivity by their being cooled by inexpensive liquid nitrogen, the possibility of practical applications of the superconducting technique has been suddenly noted.

The microwave components also enjoy the characteristic phenomena of superconductivity. That is, generally in a strip line the attenuation constant of a conductor due to a resistance is proportional to a square root of a frequency. The dielectric loss also increases with an increase of frequency. The dielectric loss in the recent strip lines is almost attributed mainly to a resistance of a conductor layer especially in the band equal to or lower than 10 GHz, due to the improvement of dielectric materials. Accordingly it improves the efficiency of the strip line to decrease the resistance of a conductor layer of the strip line. Strip lines not only can be used as mere transmission lines, but also can be patterned suitably to be microwave components, such as inductance devices, filters, resonators, delay lines, directional couplers, hybrids, etc. Accordingly the improvement of strip lines leads to the improvement of the characteristics of such microwave components.

FIG. 1 is a sectional view of a typical structure of a microwave component using oxide superconducting film as the conductor material.

As shown in FIG. 1, the microwave component comprises a first substrate 2 with a superconducting conductor line 1 formed thereon by patterning a superconducting film, a second substrate 4 with a superconducting grounding conductor 3 of a superconducting film formed thereon, which are laid on each other in a casing 5a. The casing 5a is sealed with a cover 5b, and a package is fabricated. Although not shown, a lead wire or the like is provided through the casing 5a or the cover 5b for introducing microwaves into the superconducting line 1.

This microwave component comprises two substrates for the following reason.

That is, generally a microwave component essentially includes a conductor line and a grounding conductor formed with a dielectric therebetween. On the other hand, in a superconducting microwave component, the conductor line and the grounding conductor are synthesized especially in thin films having good characteristics. But the technique of forming on the front side and the backside of one substrate film having the uniform characteristics requires a film forming operation of a high level. So far, the film forming level has not yet been practical. Presently the conductor line, and the grounding conductor are formed independently on separate substrates, and subsequently these substrates are laid on each other. And a microwave component using oxide superconducting films is prepared.

But it has been found that although a microwave component of the structure of FIG. 1 is actually fabricated, it does not exhibit required characteristics or has an extremely large loss.

SUMMARY OF THE INVENTION

It is one object of the present invention to provide a superconducting microwave component comprising a first substrate having a conductor line formed of an oxide superconductor on the surface thereof;

a second substrate having a grounding conductor formed of an oxide superconductor on the surface thereof; and a package of a conducting material housing the first and the second substrates substantially parallel with each other, at least one part of the grounding conductor being in contact with the inside of the package through surface contact.

An object of this invention is to provide a microwave component having an innovational structure which can solve the above-described problems of the conventional art, and which effectively exhibits the properties of the oxide superconducting materials. The microwave components according to this invention are characterized mainly by a unique structure which has successfully improved especially the connection of the superconducting grounding conductor formed on the second substrate with the metal package.

That is, in the microwave package of the conventional structure of FIG. 1, the superconducting grounding conductor 3 is in connection with the casing 5a only at the sides thereof. But such slight connection is not enough for its electromagnetic contact with the casing 5a, and the superconducting grounding conductor 3 cannot fully perform its function.

In contrast to this, in a microwave component according to this invention, its unique structure keeps the superconducting grounding conductor on the second substrate with the surface of the casing, and consequently the contact of the package with the superconductor can be secured. The use of a superconductor as the conductor can be effective.

In the above-described microwave component according to this invention, the oxide superconducting material forming the superconducting conductor line and the superconducting grounding conductor especially has a high superconducting critical temperature and can be made superconductive by cooling with liquid nitrogen, and is, for example, exemplified by Ln—Ba—Cu—O (Ln: Y, La, Nd, Sm, Eu, Gd, Dy, Ho, Er, Tm, Yb, Lu) based, Bi—Sr—Ca—Cu—O based, Bi—Pb—Sr—Ca—Cu—O based, Tl—Ba—Ca—Cu—O based and Tl—Bi—Ca—Sr—Cu—O based etc. These oxide superconductors can be formed directly on substrates, as of MgO, $LaAlO_3$ and $NdGaO_3$, etc. $Al_2O_3$ (sapphire), $SiO_2$, beryllia or borosilicate glass, etc. can be used as the substrate together with a buffer layer of a suitable oxide formed on the film forming surface. The material of such buffer layer is preferably exemplified by MgO, $LaAlO_3$, $NdGaO_3$, $SrTiO_3$, $Y_2O_3$, YSZ, etc.

These oxide superconducting materials can be formed in optional patterns by a lift-off technique in which a resist mask is beforehand formed on the substrate, in forming the film. The patterning may be performed by wet-etching with an etchant, such as hydrochloric acid, the superconducting layer being formed on the entire surface of the substrate. By suitably patterning the conductor line, various microwave components can be fabricated.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 2A:
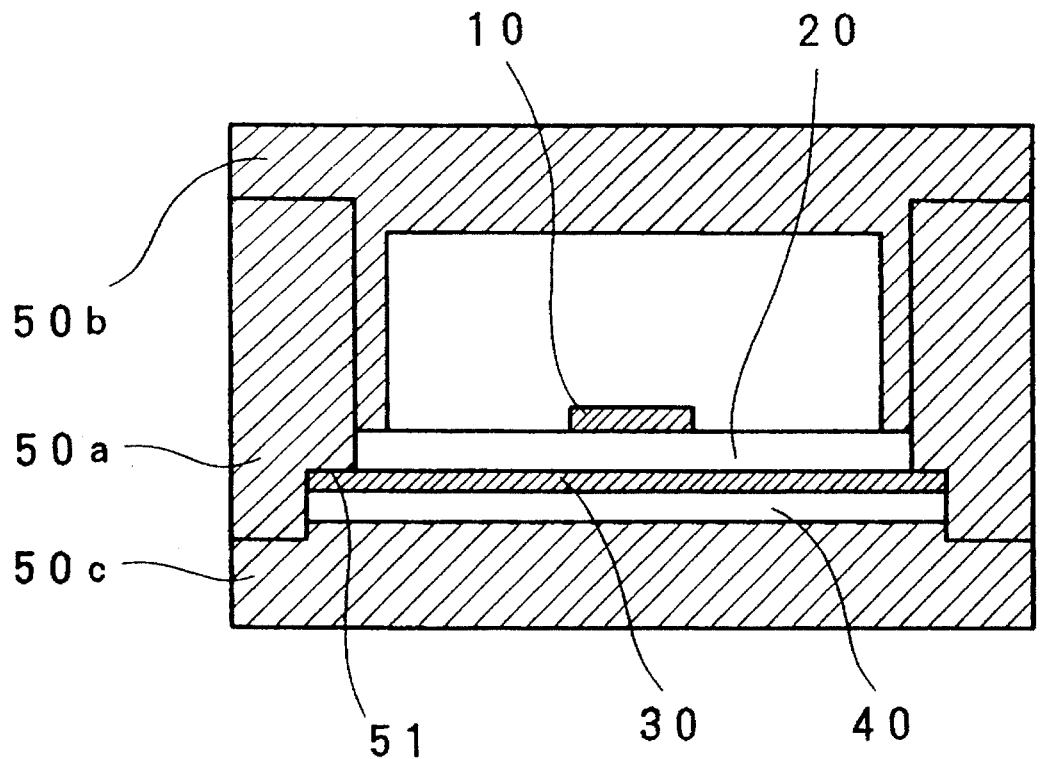
FIGS. 2A and 2B are sectional views of structures of microwave components according to this invention.
Figure 2B:
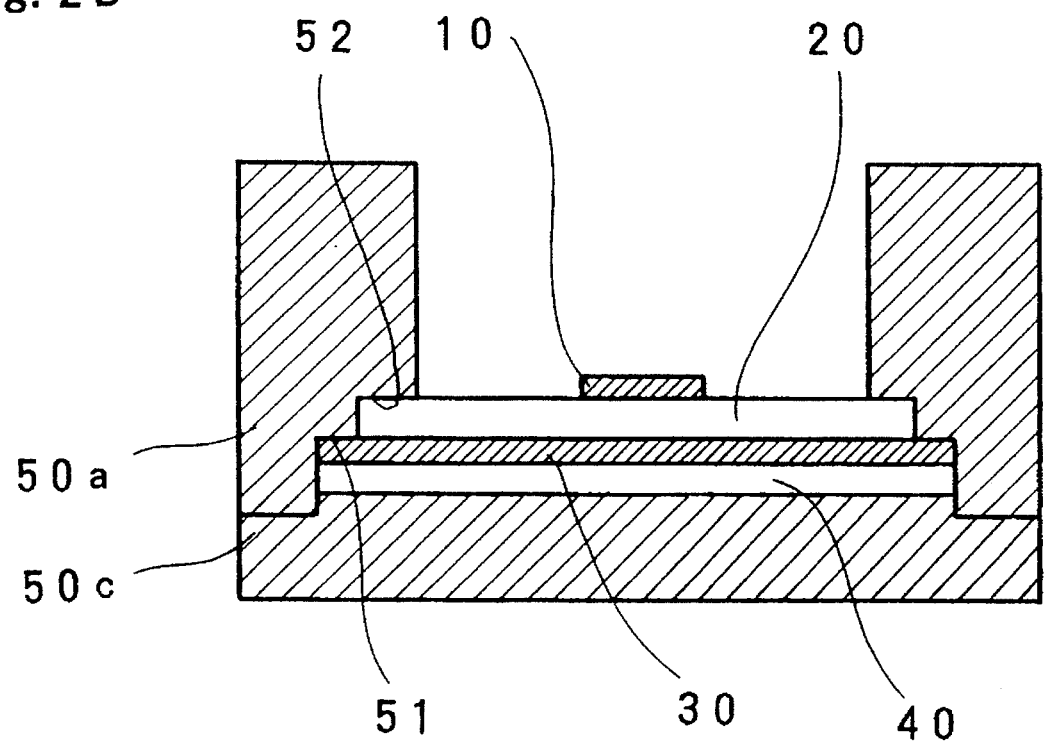

FIGS. 2A and 2B show sectional views of structures of microwave components according to this invention.

The microwave component of FIG. 2A comprises a first substrate 20 with a superconductor line 10 formed on a required pattern of an oxide superconducting film, and a second substrate 40 with a superconducting grounding conductor of the oxide superconducting film 30 formed on the entire surface, which are laid in a cylindrical casing 50a. The casing 50a is sealed with a lid body 50b and a bottom plate 50c in a package.

Differences of this microwave component from the conventional one are the first and the second substrates 20, 40 have different sizes from each other, and to accommodate their size difference there is formed a step 51 on the inside of the cylindrical casing 50a. That is, in this microwave component, the second substrate 40 has a larger size than the first substrate 20. Accordingly the superconducting grounding conductor 30 on the second substrate 40 is in contact with the step 51 at the sides.

In this microwave component, since the second substrate 40 is inserted into the cylindrical casing 50a through the bottom, the bottom of the casing 50a is sealed with the bottom plate 50c. Although not shown, a lead wire or others are provided through the casing 50a or the lid body 50b for introducing microwaves into the conductor line 10.

The microwave component of FIG. 2B has basically the same structure as that of FIG. 2A. But in the microwave component of FIG. 2B, both the first and the second substrates 20 (with superconductor line 10), and 40 are inserted together into the cylindrical casing 50a through the bottom, and the lid body 50b is omitted. That is, there are formed two steps 51, 52 on the inside of the cylindrical casing 50a. The substrates 20, 40 are held respectively between the steps 51 and 52, and the bottom body 50c. As in the microwave component of FIG. 2A, the first and the second substrates 20, 40 have different sizes from each other, and the superconducting grounding conductor 30 on the second substrate 40 is in surface-contact with the step 51 on the casing 50a.

Figure 3A:
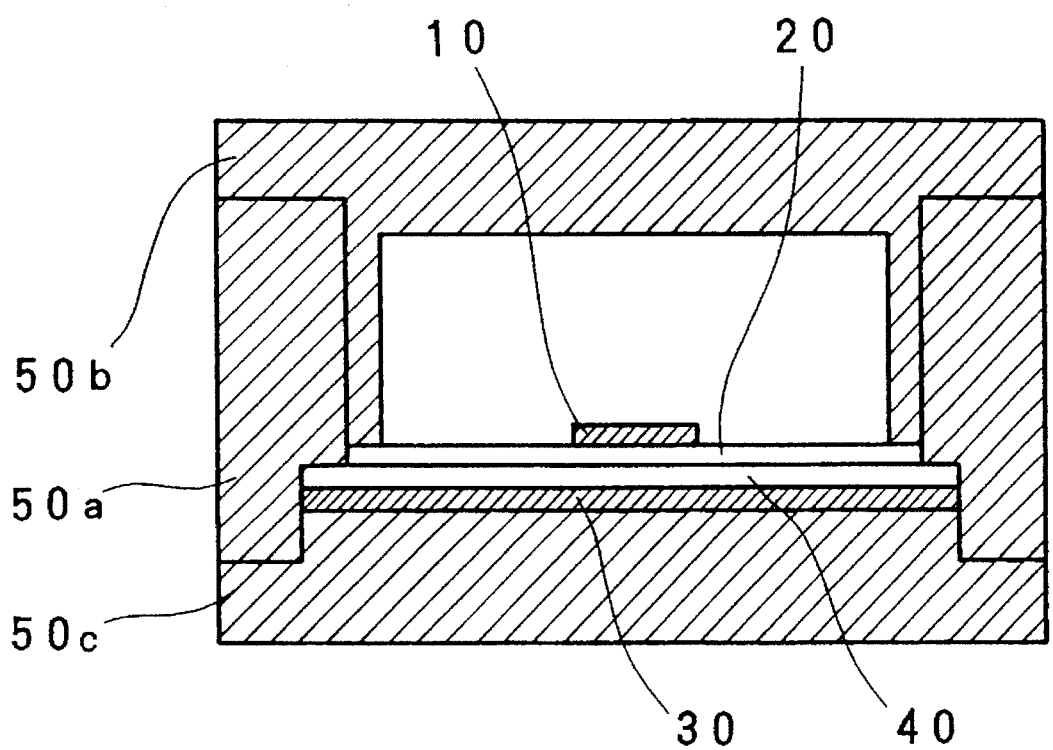
FIGS. 3A and 3B are sectional views of structures of different microwave components according to this invention.
Figure 3B:
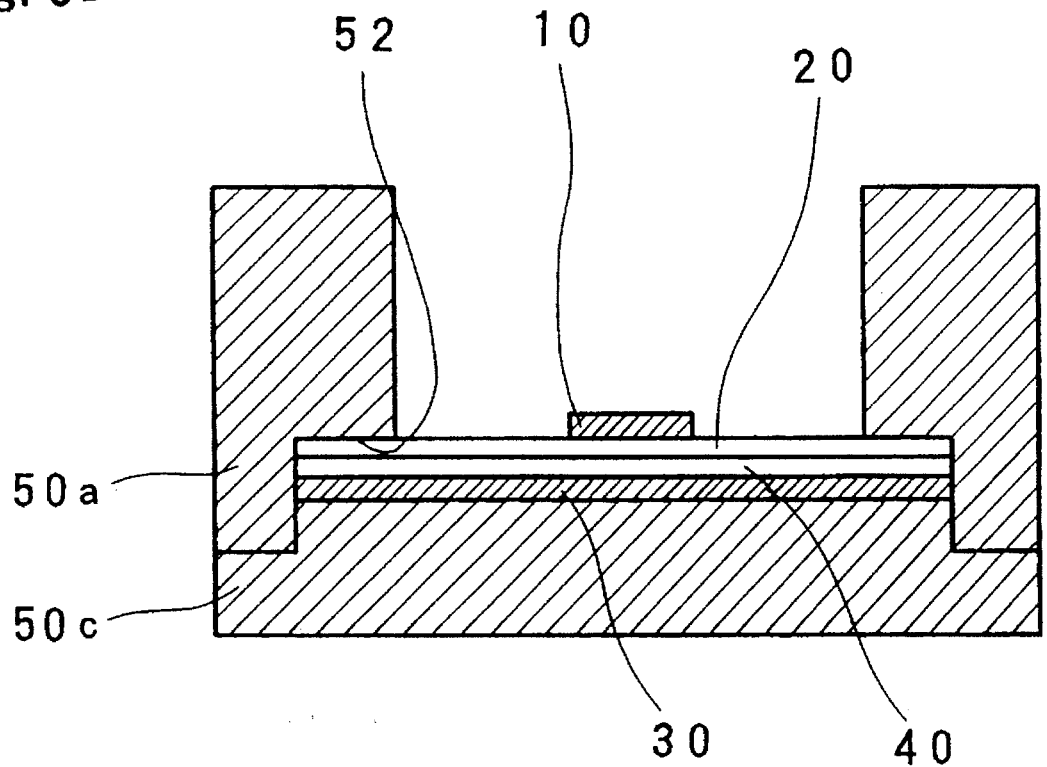

FIGS. 3A and 3B respectively show sectional views of structures of different embodiments. Differences which characterize the microwave components of FIGS. 3A and 3B in comparison with the microwave components of FIGS. 2A and 2B are the first and the second substrates 20, 40 are laid so that the face of the first substrate 20 with the conductor line 10 formed thereon, and the face of the second substrate 40 with the grounding conductor 30 formed on are located on opposite sides to each other. In this case, the grounding conductor 30 is in face-contact with the inside of the bottom body 50c.

Figure 4A:
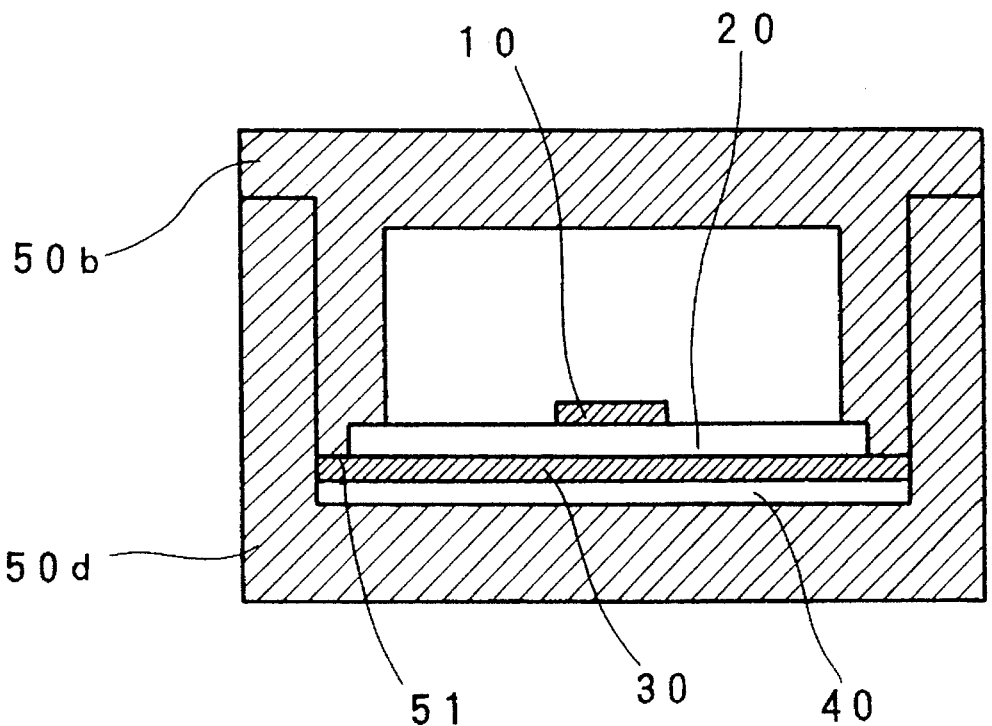
FIGS. 4A and 4B are sectional views of structures of microwave components according to this invention.
Figure 4B:
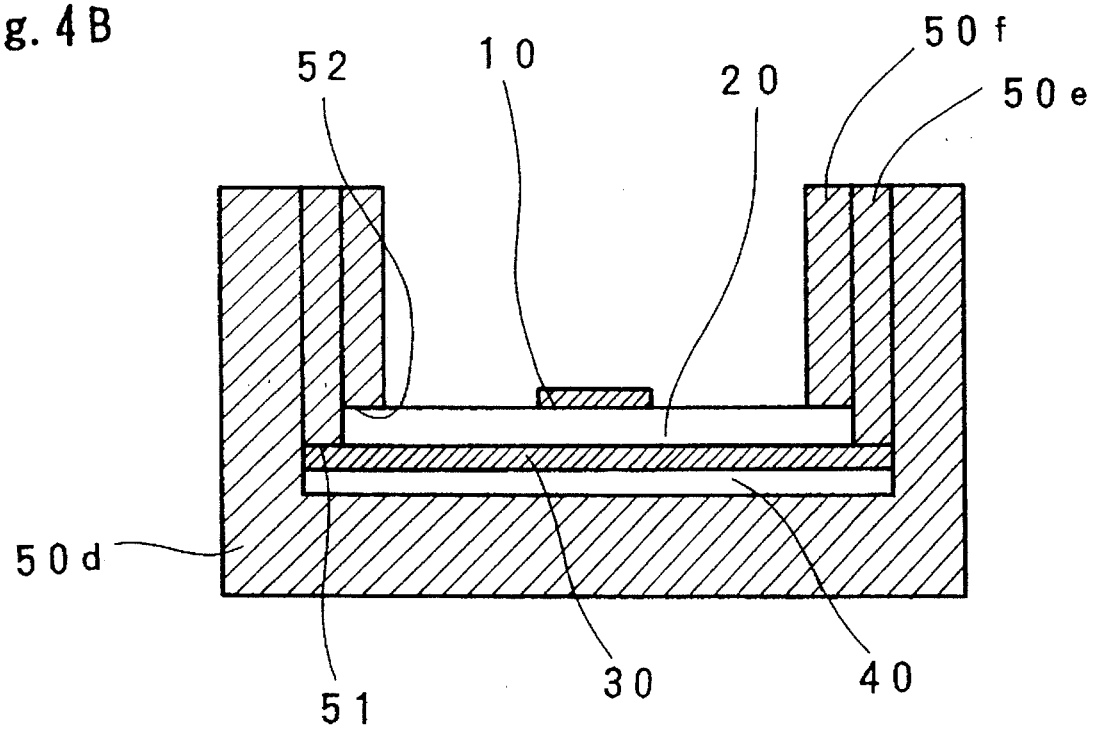

In the above-described embodiments, the cylindrical casing 50a, the lid body 50b, and the bottom body 50c are separate members and are assembled. But as shown in FIGS. 4A and 4B, the casing 50a and the bottom plate 50c may be a one-piece casing 50d. In this case, it is a little difficult to load the first and the second substrates 20 and 40, but the face-contact of the grounding conductor 30 with the package can be similarly achieved.

In the structure of FIG. 4A, firstly the first substrate 20 with the line conductor 10 is fit into the step 51 formed on the forward end of the projection of the lid body 50b, and next the second substrate 40 is loaded to be in contact with the inside of the casing 50d. The structure of FIG. 4B is fabricated by firstly setting the second substrate 40 with grounding conductor 30 inside the casing 50d, then inserting a first cylindrical presser member 50e into the casing 50d, then setting the first substrate 20 with line conductor 10, and then inserting a second cylindrical presser member 50f into the casing 50d to form two steps 51, 52.

FABRICATION EXAMPLE 1

A superconducting microwave resonator was fabricated as a microwave component with the sectional structure of FIG. 2A. Characteristics of this superconducting microwave resonator were measured.

As the first substrate 20, a 18 mm-square and 1 mm-thickness MgO substrate was used. The conductor line 10 was formed of Y—Ba—Cu composite oxide film having a 5000 Å-thickness.

Figure 5:
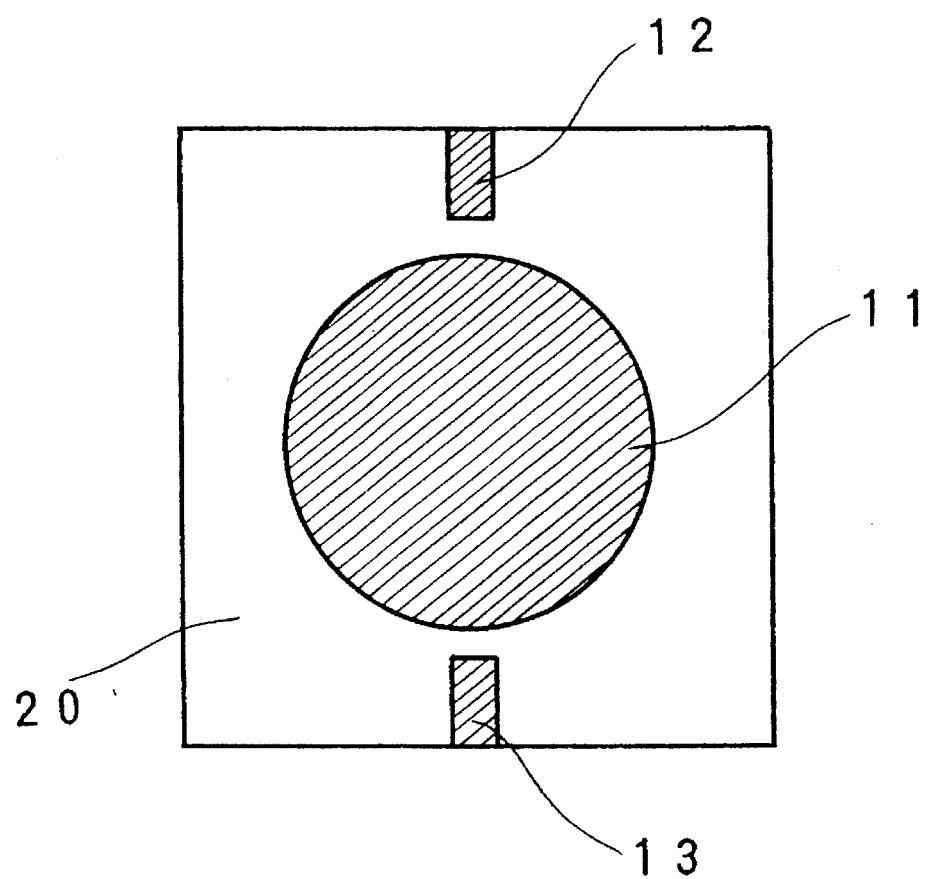
FIG. 5 is a view of the pattern of the conductor line of a fabrication example of this invention.

FIG. 5 shows a pattern of the superconducting conductor line 10 of this superconducting microwave resonator. As shown in FIG. 5, this superconducting microwave resonator comprises a 12 mm-diameter round superconducting conductor line 11 on the first substrate 20, and a pair of superconducting conductor lines 12, 13 for leading in and out microwaves to the superconducting conductor line 11. Each conductor line has a 1.1 mm-width and a 2.0 mm-length. A minimum gap between the respective waveguides 12 and 13 was 1.0 mm.

As the second substrate 40, a 20 mm-square and 1 mm-thickness MgO substrate was used. The grounding conductor 30 was formed with a 5000 Å-thickness Y—Ba—Cu composite oxide film.

The prepared two substrates 20, 40 were housed in a brass cylindrical casing 50a, and the casing 50a was sealed with a brass lid body 50b and a bottom body 50c. A package thus was fabricated.

Figure 6:
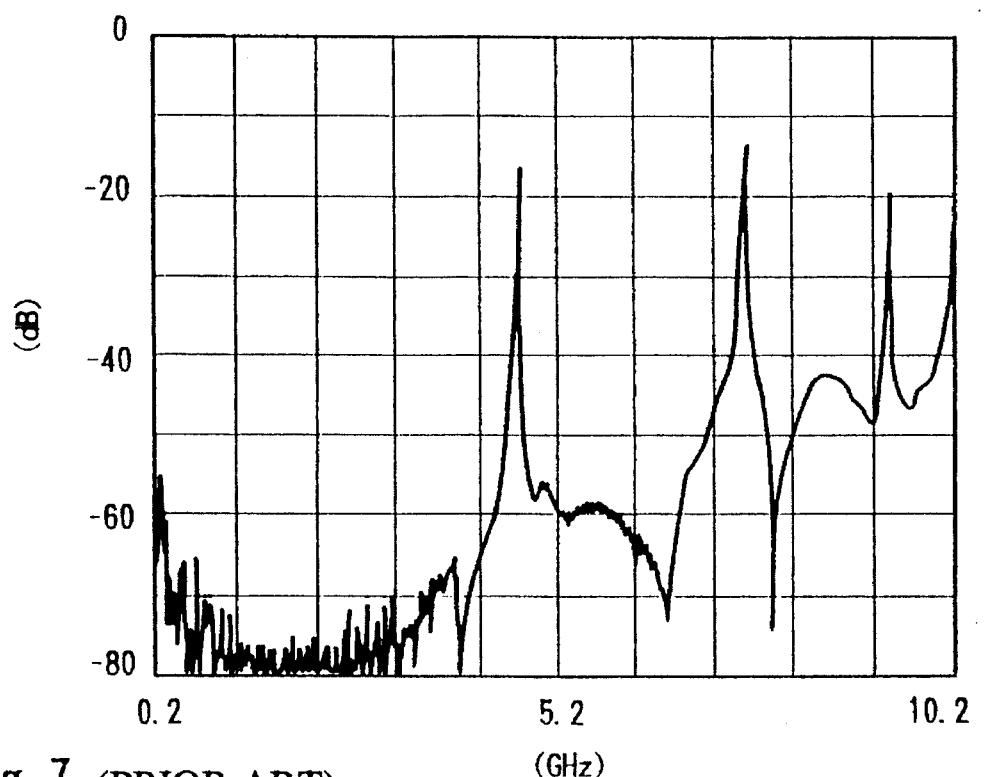
FIG. 6 is a graph of the characteristic of a microwave resonator having the sectional structure of FIG. 1.

The prepared superconducting microwave resonator was measured by a network analyzer with respect to the frequency characteristic of the transmission power. FIG. 6 is a graph showing the measured result. The measuring temperature was 77K. The measured result shown in FIG. 6 is for the 0.2 to 10.2 GHz band. As shown in FIG. 6, the frequency characteristic of this superconducting microwave resonator had three sharp peaks. The Q-values of this superconducting microwave resonator are shown in Table 1.

TABLE 1

| frequency (GHz) | 4.5 | 7.4 |
|---|---|---|
| Q-values | 2120 | 1540 |

Figure 1:
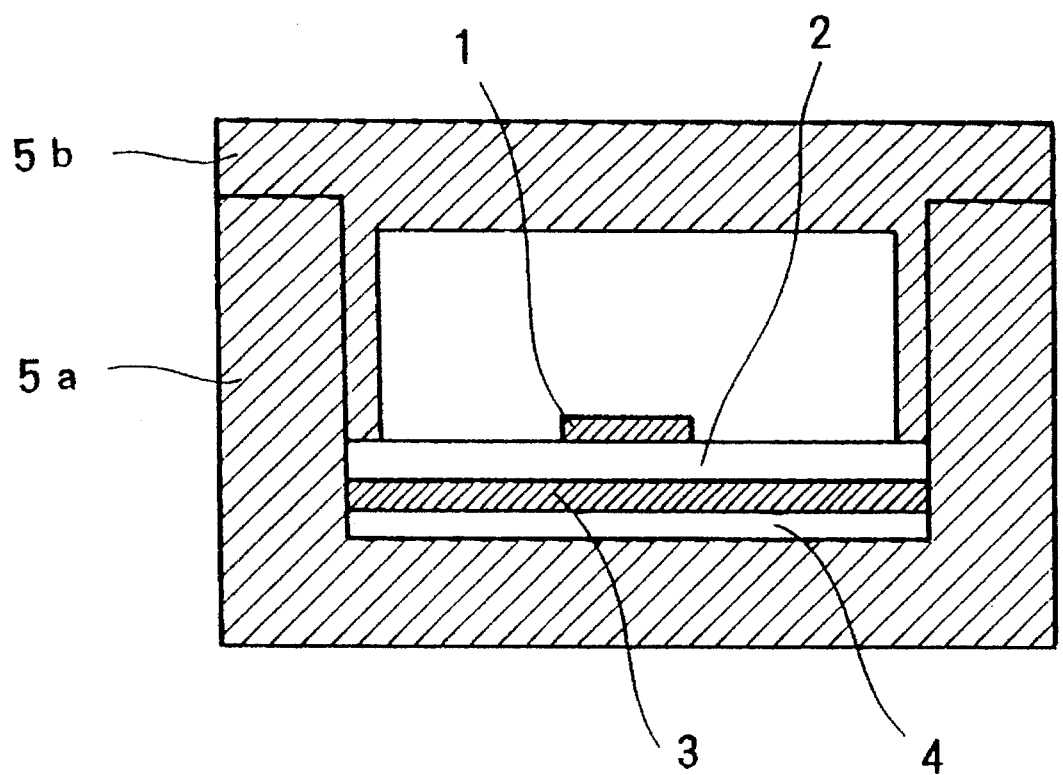
FIG. 1 is a sectional view of a structure of the conventional microwave component.

As a control, a superconducting microwave resonator having the conventional structure of FIG. 1 was fabricated using the same materials. But the second substrate 4 was prepared with a 18 mm-square and 1 mm-thickness MgO substrate. The casing 5a had no step on the inside.

Figure 7:
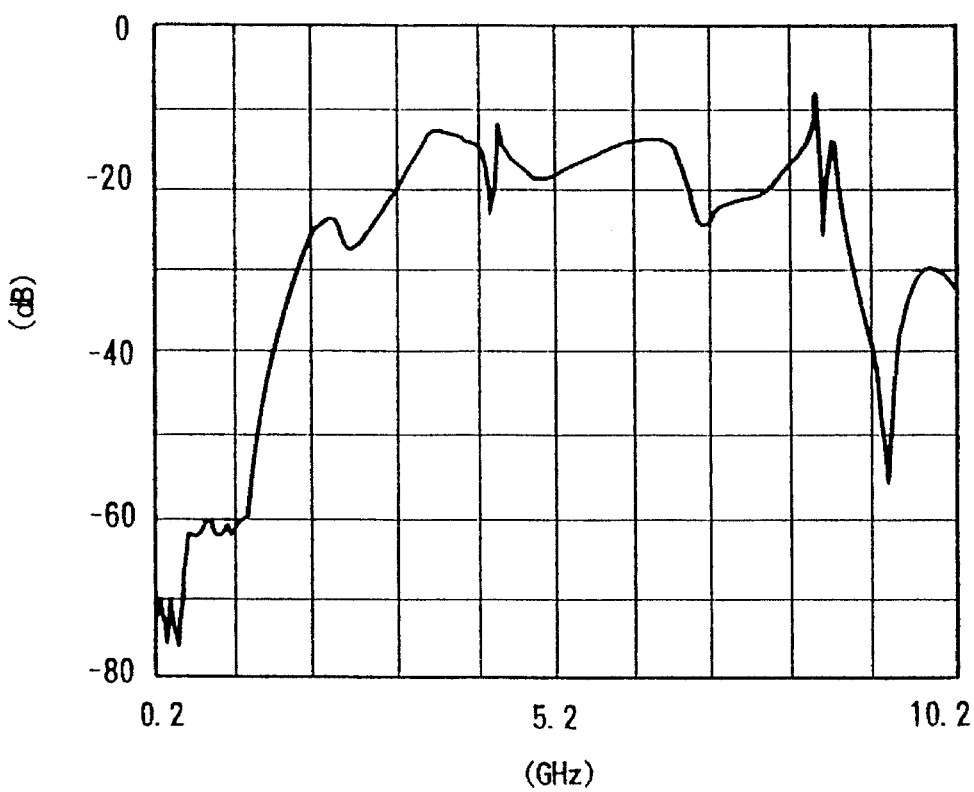
FIG. 7 is a graph of the characteristic of a microwave resonator having the sectional structure of FIG. 1.

FIG. 7 is a graph showing the measured frequency characteristic of the transmission power of this comparison sample. As shown in FIG. 7, there is no conspicuous peak. It is seen that the comparison sample did not effectively work as a resonator. No Q-value could be measured because this sample exhibited no significant resonance characteristic.

As described above in good detail, according to this invention, microwave components using oxide superconducting films as the conductors can be realized.

In these microwave components, the grounding conductors, and the conductor lines become superconductive by cooling by inexpensive liquid nitrogen, and the conductor loss can be extremely minimized. Consequently the properties of microwave components can be much improved, and their applicable frequency bands can be expanded to the side of higher frequencies.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:
1. A superconducting microwave component comprising:
a first substrate comprised of a first dielectric material and having a first surface and a conductor line comprised of an oxide superconductor disposed on the first surface thereof;
a second substrate comprised of the first dielectric material and having a second surface and a grounding conductor comprised of an oxide superconductor disposed on the second surface thereof; and
a package comprised of a conducting material housing the first and the second substrate such that the first and second surfaces are arranged substantially in parallel, at least one part of the grounding conductor electrically contacting an inner surface of the package by direct surface contact therewith, wherein
the package comprises a bottom plate, and a casing having a lower end face fixed to a peripheral edge portion of the bottom plate and a first stepped face defining in part said inner surface, said first stepped face being proximate the lower end face; whereby a peripheral edge portion of the second substrate is held between the bottom plate and the first stepped face.

2. A superconducting microwave component according to claim 1, wherein the first substrate is selected from the group consisting of: MgO, LaAlO$_3$ and NdGaO$_3$.

3. A superconducting microwave component according to claim 1, wherein a peripheral edge portion of the grounding conductor is in contact with the first stepped face.

4. A superconducting microwave component according to claim 1, wherein the first substrate comprises a substrate selected from the group consisting of: Al$_2$O$_3$, SiO$_2$, beryllia and borosilicate glass, and a buffer layer selected from the group consisting of: MgO, LaAlO$_3$, NdGaO$_3$, SrTiO$_3$, Y$_2$O$_3$ and YSZ.

5. A superconducting microwave component according to claim 1, wherein the casing has a second stepped face for holding a peripheral edge portion of the first substrate between the second substrate and the second stepped face.

6. A superconducting microwave component according to claim 1, wherein the package further includes a lid body attached to an upper end face of the casing, and the lid body has an inside projection means for pressing down a peripheral edge portion of the first substrate.

7. A superconducting microwave component according to claim 1, wherein the oxide superconductor is selected from the group consisting of: Ln element-Ba—Cu—O based material, Bi—Sr—Ca—Cu—O based material, Bi—Pb—Sr—Ca—Cu—O based material, Tl—Ba—Ca—Cu—O based material and Tl—Bi—Ca—Sr—Cu—O based material.

8. A superconducting microwave component according to claim 1, wherein the package is comprised of a metal material.

9. A superconducting microwave component according to claim 1, wherein the second substrate is selected from the group consisting of: MgO, LaAlO$_3$ and NdGaO$_3$.

10. A superconducting microwave component according to claim 1, wherein the second substrate comprises a substrate selected from the group consisting of: Al$_2$O$_3$, SiO$_2$, beryllia and borosilicate glass, and a buffer layer selected from the group consisting of: MgO, LaAlO$_3$, NdGaO$_3$, SrTiO$_3$, Y$_2$O$_3$ and YSZ.

11. A superconducting microwave component comprising:
a first substrate having a conductor line comprised of an oxide superconductor disposed on a first surface thereof;

a second substrate having a grounding conductor comprised of an oxide superconductor disposed on a second surface thereof; and a package comprised of a conducting material housing the first and the second substrates such that the first and second surfaces are substantially parallel, the package including a bottom plate, and a casing having a lower end surface fixed to a peripheral edge portion of the bottom plate and a first stepped face defining in part said inner surface, said first stepped face being proximate the lower end surface whereby a peripheral edge portion of the second substrate is held between the bottom plate and the first stepped face, the grounding conductor being in contact with the bottom plate.

12. A superconducting microwave component according to claim 11, wherein the second substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

13. A superconducting microwave component according to claim 11, wherein the first substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

14. A superconducting microwave component according to claim 11, wherein the first substrate is selected from the group consisting of: MgO, $LaAlO_3$ and $NdGaO_3$.

15. A superconducting microwave component according to claim 11, wherein the second substrate is selected from the group consisting of: MgO, $LaAlO_3$ and $NdGaO_3$.

16. A superconducting microwave component according to claim 11, wherein a peripheral edge portion of the grounding conductor is in contact with the first stepped face.

17. A superconducting microwave component according to claim 11, wherein the casing has a second stepped face for holding a peripheral edge portion of the first substrate between the second substrate and the second stepped face.

18. A superconducting microwave component according to claim 11, wherein the package further includes a lid body attached to an upper end face of the casing, and the lid body has an inside projection means for pressing down on a peripheral edge portion of the first substrate.

19. A superconducting microwave component according to claim 11, wherein the first substrate is arranged on the second substrate; and wherein a peripheral edge portion of the first substrate is also held between the bottom plate and the stepped face.

20. A superconducting microwave component according to claim 11, wherein the first substrate an area which is smaller than an area of the second substrate, the second substrate is arranged on the bottom plate and the first substrate is arranged on the second substrate, and wherein the package includes a presser member inserted in the casing to be in contact with a peripheral edge portion of the grounding conductor.

21. A superconducting microwave component according to claim 20, wherein the package further includes a lid body attached to an open end of the casing and the presser member is secured to the lid body.

22. A superconducting microwave component according to claim 11, wherein the package is comprised of a metal material.

23. A superconducting microwave component according to claim 11, wherein the oxide superconductor is selected from the group consisting of: Ln element-Ba—Cu—O based material, Bi—Sr—Ca—Cu—O based material, Bi—Pb—Sr—Ca—Cu—O based material, Tl—Ba—Ca—Cu—O based material and Tl—Bi—Ca—Sr—Cu—O based material.

24. A superconducting microwave component comprising:

a first substrate comprised of a first dielectric material and having a first surface and a conductor line comprised of an oxide superconductor disposed on the first surface thereof;

a second substrate comprised of the first dielectric material and having a second surface and a grounding conductor comprised of an oxide superconductor disposed on the second surface thereof; and a package comprised of a conducting material housing the first and the second substrate such that the first and second surfaces are arranged substantially in parallel, at least a part of the grounding conductor electrically contacting an inner surface of the package by direct surface contact therewith, wherein the package comprises a bottom plate, and a casing having a lower end face portion with a lower end face fixed to a peripheral edge portion of the bottom plate and a stepped face defining in part said inner surface; and wherein the first substrate is arranged on the second substrate, and wherein a peripheral edge portion of the first substrate and a peripheral portion of the second substrate respectively are held between the bottom plate and the stepped face.

25. A superconducting microwave component according to claim 24, wherein the first substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

26. A superconducting microwave component according to claim 24, wherein the second substrate is selected from the group consisting of: MgO, $LaAlO_3$ and $NdGaO_3$.

27. A superconducting microwave component according to claim 24, wherein the second substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

28. A superconducting microwave component according to claim 24, wherein the package is comprised of a metal material.

29. A superconducting microwave component according to claim 24, wherein the oxide superconductor is selected from the group consisting of: Ln element-Ba—Cu—O based material, Bi—Sr—Ca—Cu—O based material, Bi—Pb—Sr—Ca—Cu—O based material, Tl—Ba—Ca—Cu—O based material and Tl—Bi—Ca—Sr—Cu—O based material.

30. A superconducting microwave component according to claim 24, wherein the first substrate is selected from the group consisting of: MgO, $LaAlO_3$ and $NdGaO_3$.

31. A superconducting microwave component comprising:

a first substrate comprised of a first dielectric material and having a first surface and a conductor line comprised of an oxide superconductor disposed on the first surface thereof;

a second substrate comprised of the first dielectric material and having a second surface and a grounding conductor comprised of an oxide superconductor disposed on the second surface thereof; and a package comprised of a conducting material housing the first and the second substrate such that the first and second surfaces are arranged substantially in parallel, at least one part of the grounding conductor electrically contacting an inner surface of the package by direct surface contact therewith, wherein the package comprises a bottom plate and a casing, wherein the first substrate has an area which is smaller than an area of the second substrate, the second substrate is arranged on the bottom plate and the first substrate is arranged on the second substrate, and wherein the package includes a presser member inserted in the casing to be in contact with a peripheral edge portion of the grounding conductor.

32. A superconducting microwave component according to claim 31, wherein the package further includes a lid body attached to an open end of the casing and the presser member is secured to the lid body.

33. A superconducting microwave component according to claim 31, wherein the second substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

34. A superconducting microwave component according to claim 31, wherein the package is comprised of a metal material.

35. A superconducting microwave component according to claim 31, the oxide superconductor is selected from the group consisting of: Ln element-Ba—Cu—O based material, Bi—Sr—Ca—Cu—O based material, Bi—Pb—Sr—Ca—Cu—O based material, Tl—Ba—Ca—Cu—O based material and Tl—Bi—Ca—Sr—Cu—O based material.

36. A superconducting microwave component according to claim 31, wherein the first substrate is selected from the group consisting of: MgO, $LaAlO_3$ and $NdGaO_3$.

37. A superconducting microwave component according to claim 31, wherein the second substrate is selected from the group consisting of: MgO, $LaAlO_3$ and $NdGaO_3$.

38. A superconducting microwave component according to claim 31, wherein the first substrate comprises a substrate selected from the group consisting of: $Al_2O_3$, $SiO_2$, beryllia and borosilicate glass, and a buffer layer selected from the group consisting of: MgO, $LaAlO_3$, $NdGaO_3$, $SrTiO_3$, $Y_2O_3$ and YSZ.

* * * * *